（12） United States Patent
Nero, Jr. et al.

(10) Patent No.: US 9,425,741 B2
(45) Date of Patent: *Aug. 23, 2016

(54) SYSTEMS AND METHODS FOR PROVIDING MODULATION OF SWITCHMODE RF POWER AMPLIFIERS

(71) Applicant: Stryker Combo L.L.C., Bingham Farms, MI (US)

(72) Inventors: Regis J Nero, Jr., Export, PA (US); Jeffrey A Gibala, North Huntingdon, PA (US)

(73) Assignee: STRYKER COMBO, L.L.C., Bingham Farms, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/692,293

(22) Filed: Apr. 21, 2015

(65) Prior Publication Data

US 2015/0280649 A1    Oct. 1, 2015

Related U.S. Application Data

(63) Continuation of application No. 12/961,089, filed on Dec. 6, 2010, now Pat. No. 9,041,479.

(51) Int. Cl.
*H03F 1/02* (2006.01)
*H03F 3/24* (2006.01)
*H03F 3/19* (2006.01)
(Continued)

(52) U.S. Cl.
CPC .............. *H03F 1/02* (2013.01); *H03F 1/0227* (2013.01); *H03F 3/19* (2013.01); *H03F 3/217* (2013.01); *H03F 3/245* (2013.01);
(Continued)

(58) Field of Classification Search
CPC ....... H02M 7/537; H03F 3/245; H03F 1/0227
USPC .......... 330/10, 127, 297; 340/140.1; 323/282, 323/311
See application file for complete search history.

(56) References Cited

U.S. PATENT DOCUMENTS 6,029,087 A    2/2000 Wohlgemuth
7,557,551 B1    7/2009 Somerville et al.
(Continued)

OTHER PUBLICATIONS

International Search Report for PCT/US2011/063264 dated Mar. 2012.
(Continued)

*Primary Examiner* — Jeffrey Shin
(74) *Attorney, Agent, or Firm* — Howard & Howard Attorneys PLLC

(57) ABSTRACT

Systems and methods are provided for generating an amplitude modulation signal to a switchmode power amplifier. A DC to DC switch is configured to receive a DC input voltage and to provide a DC output voltage. A low dropout regulator is configured to provide the amplitude modulation signal according to a modulation control signal received by the low dropout regulator. A control circuit is configured to establish a nominal operating power level for the power amplifier via the amplitude modulation signal and to maintain a minimum voltage difference between the DC output voltage and the low dropout regulator output. A modulator control circuit is configured to provide the modulation control signal to the low dropout regulator. The modulator control circuit provides the transition from a high amplitude to a low amplitude and a transition from the low amplitude to the high amplitude at configurable first and second slopes, respectively.

19 Claims, 20 Drawing Sheets

(51) Int. Cl.
*H03F 3/217* (2006.01)
*H02M 1/00* (2006.01)

(52) U.S. Cl.
CPC . *H02M 2001/0045* (2013.01); *H03F 2200/324* (2013.01); *H03F 2200/451* (2013.01)

(56) References Cited

U.S. PATENT DOCUMENTS

| | | | |
|---|---|---|---|
| 7,679,433 | B1 | 3/2010 | Li |
| 9,041,479 | B2 * | 5/2015 | Nero et al. .................. 332/159 |
| 2005/0020220 | A1 | 1/2005 | Gamou |
| 2006/0187044 | A1 | 8/2006 | Fabian et al. |
| 2006/0293003 | A1 | 12/2006 | McCune |
| 2009/0082027 | A1 | 3/2009 | Yavuz et al. |
| 2009/0117865 | A1 | 5/2009 | Vinayak et al. |
| 2009/0189689 | A1 | 7/2009 | Cioffi et al. |

OTHER PUBLICATIONS

Written Opinion of the International Searching Authority for PCT/US2011/063264 dated Mar. 2012.
LT1575/LT1577; Datasheet: Ultrafast Transient Response, Low Dropout Regulators Adjustable and Fixed; Linear Technology; 1996.
L22678; Datasheet: 5A Simple Switcher, Step-Down Voltage Regulator with Precision Enable; National Semiconductor; 2008.
LTC2630; Datasheet Single 12-/10-/8-Bit Rail-to-Rail DACs with 10ppm/degree C, Reference in SC70; Linear Technology; 2007.
DAC908; Datasheet: Speedplus 8 Bit, 165 MSPS, Digital-to-Analog Converter; Texas Instruments; 2003.
LT6220/LT6221/LT6222; Datasheet: Single/Dual/Quad 60MHz, 20V/microsecond, Low Power, Rail-to-Rail Input and Output Precision Op Amps; Linear Technology; 2003.

* cited by examiner

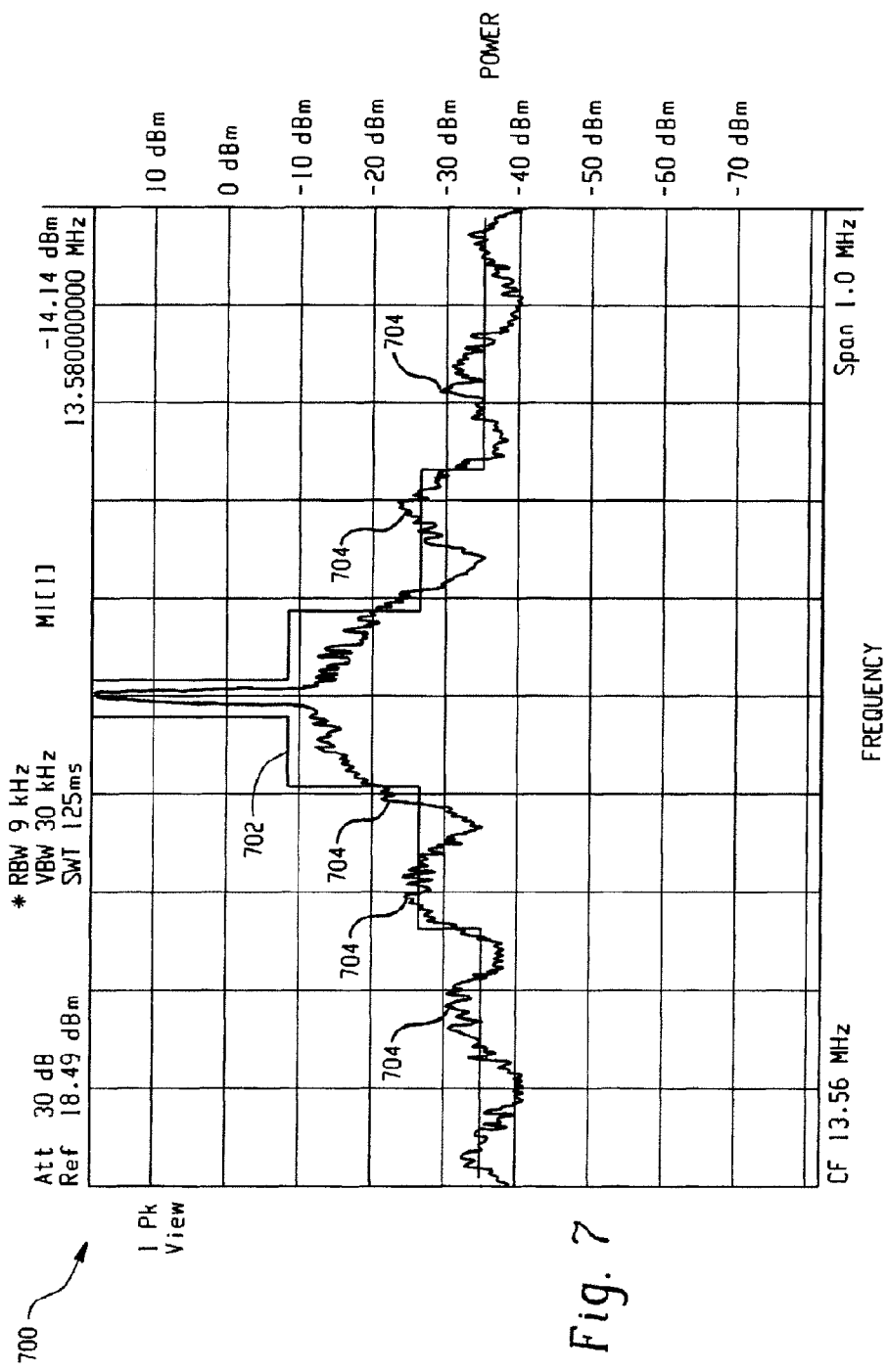

SYSTEMS AND METHODS FOR PROVIDING MODULATION OF SWITCHMODE RF POWER AMPLIFIERS

CROSS-REFERENCE TO RELATED APPLICATIONS

This application is a continuation of U.S. patent application Ser. No. 12/961,089, filed Dec. 6, 2010, and entitled "Systems and Methods for Providing Modulation of Switchmode RF Power Amplifiers" the entirety of which is incorporated herein by reference in its entirety.

TECHNICAL FIELD

The present disclosure relates generally to signal processing and more particularly to switchmode RF power amplifiers.

BACKGROUND

The Class E amplifier is a highly efficient switchmode power amplifier. In a Class E amplifier, the transistor is connected via a serial LC circuit to the load and connected via a large inductor to the supply voltage. The supply voltage is connected to ground via a large capacitor to prevent any RF signals leaking into the supply. The Class E amplifier adds a capacitor between the transistor and ground and uses a defined inductor to connect to the supply voltage. The systems and methods described herein are operable with a class E amplifier as well as other amplifier classes.

SUMMARY

In accordance with the teachings provided herein, systems and methods are described for providing an amplitude modulation signal to a switchmode amplifier. A DC to DC switch may be configured to receive a DC input voltage at one level and to provide a DC output voltage at a different level at high efficiency. A low dropout regulator (LDO) may be configured to provide the amplitude modulation signal according to a modulation control signal received by the low dropout regulator, the low dropout regulator being powered by the DC output voltage. A control circuit may be connected to the DC to DC switch and the low dropout regulator, where the control circuit is configured to establish a nominal operating power level for the power amplifier via the amplitude modulation signal and to maintain a minimum voltage difference between the DC output voltage and LDO output. A modulator control circuit may be configured to provide the modulation control signal to the low dropout regulator, the modulation control signal including transitions from a high amplitude to a low amplitude back to a high amplitude, where the modulator control circuit provides the transition from the high amplitude to the low amplitude at a configurable first slope, and the modulator control circuit provides the transition from the low amplitude to the high amplitude at a configurable second slope.

As another example, a method of generating an amplitude modulation signal to a switchmode power amplifier using a DC to DC switch, a low dropout regulator, a control circuit, and a modulator control circuit may include providing a DC input voltage to the DC to DC switch to provide a DC output voltage. A minimum voltage difference may be maintained between the DC output voltage and the low dropout regulator using a control circuit connected to the DC to DC switch and to the low dropout regulator. A modulation signal may be provided to the low dropout regulator using a modulator control circuit, where the modulation control signal includes transitions from a high amplitude to a low amplitude back to a high amplitude. The modulator control circuit may provide the transition from the high amplitude to the low amplitude at a configurable first slope, and the modulator control circuit may provide the transition from the low amplitude to the high amplitude at a configurable second slope.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

FIG. 7 is a graph depicting the spectrum of the square wave signal depicted in FIG. 6.

DETAILED DESCRIPTION

Figure 1:
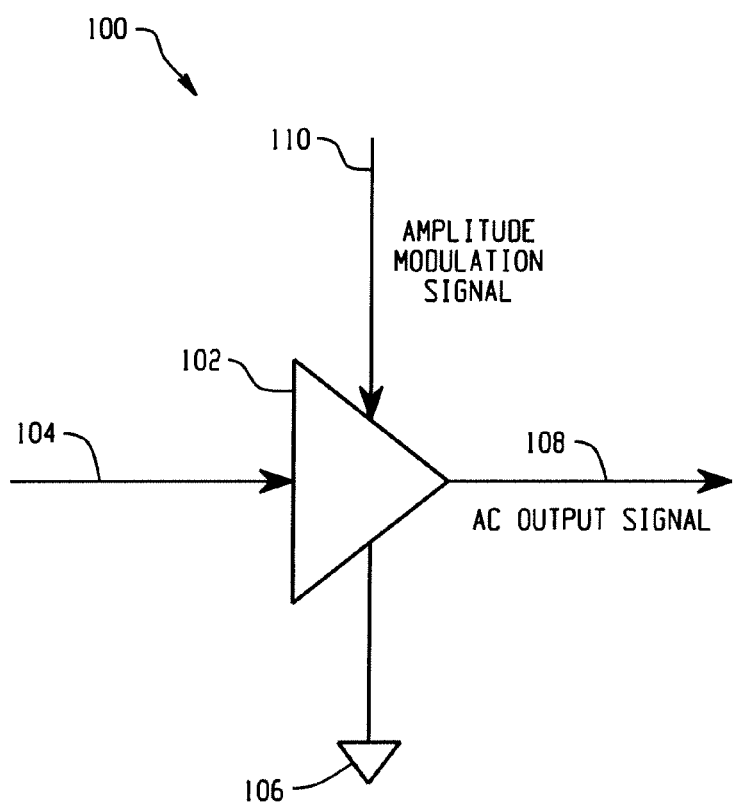
FIG. 1 is a block diagram depicting an example amplifier.

FIG. 1 is a block diagram depicting an example amplifier. The amplifier 102 is connected to a power node 110 and a ground node 106. The switch node 104 provides a reference switch signal at a carrier frequency to operate the switchmode power amplifier. The power node 1 may provide a DC voltage at a certain level. The amplifier 102 provides an AC output signal 108 based on a received amplitude modulation signal 110. The AC output signal 108 has a magnitude that is proportional to the amplitude modulation signal 110 at a particular carrier frequency received at 104. An example amplifier may be a class E amplifier. It should be noted that the systems and methods described herein may also be utilized with other types and classes of amplifiers.

Figure 2:
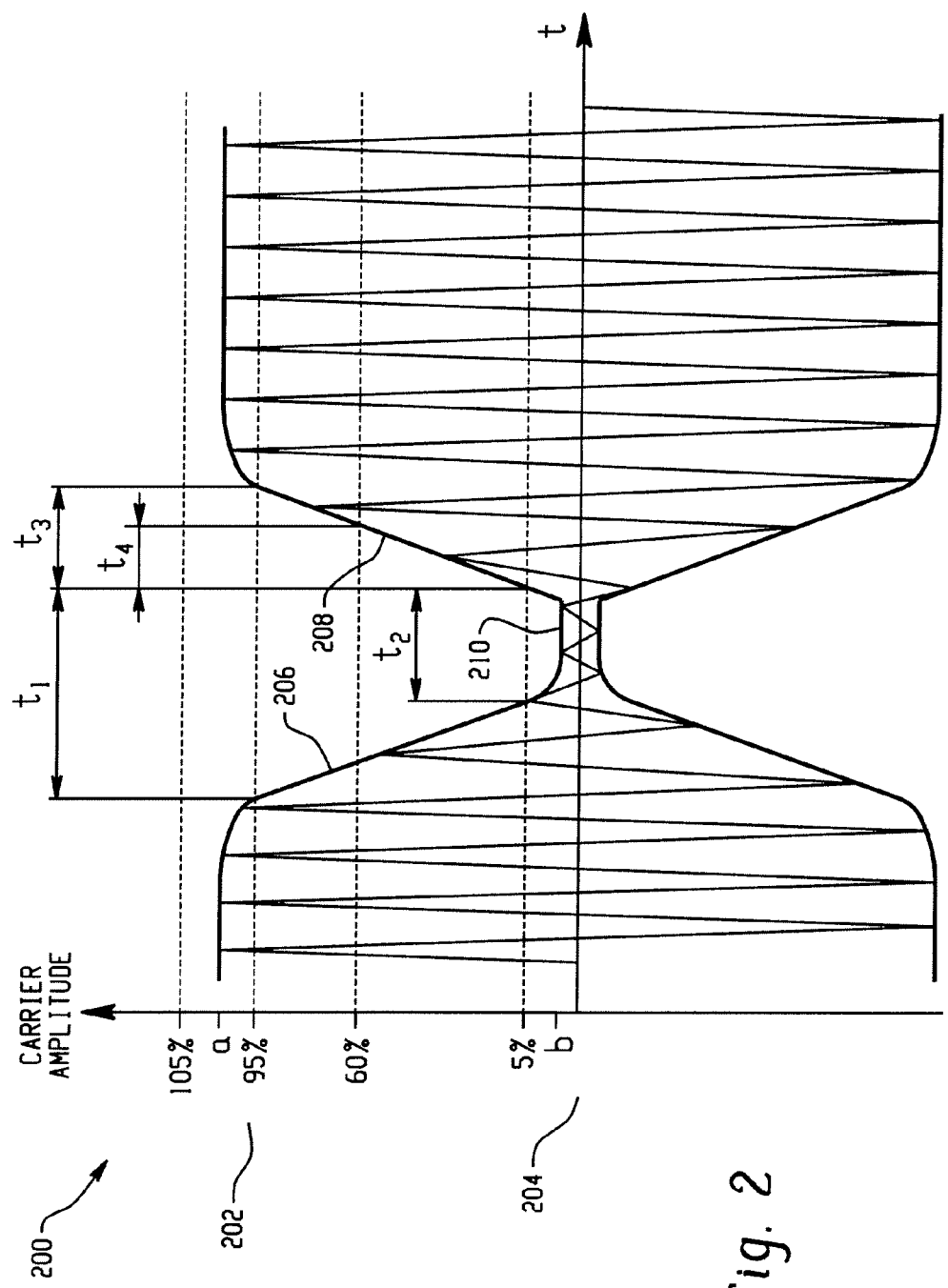
FIG. 2 depicts an example of a modulated AC output signal produced by an amplifier.

FIG. 2 depicts an example modulated AC output signal produced by an amplifier. The example AC output signal is propagated at a particular (carrier) frequency, where the carrier frequency is established by a signal at node 104 and amplitude set by node 110. The amplitude of the AC output signal is varied by the amplifier according to a received amplitude modulation signal. For example, when the amplitude modulation signal is at a high level, then the AC output signal may be transmitted at a high magnitude (e.g., before time period ti and after time period $t_3$). When the amplitude modulation is at a low level, then the AC output signal may be transmitted at a low magnitude (e.g., during time period $t_2$). The AC output signal may also be transmitted at an intermediate magnitude as dictated by the amplitude modulation signal (e.g., when the AC output signal is configured to differentiate between more than two levels, during a transition between a high magnitude and a low magnitude). The amplifier may be a high speed device, wherein changes in the amplitude modulation signal are quickly reflected in the AC output signal.

The example AC output signal has a variety of features. The AC output signal has a high magnitude at level a 202 and a low magnitude at a level b 204. The difference between level a 202 and level b 204 is the modulation depth of the AC output signal. The transition between the high magnitude 202 and the low magnitude occurs at a first slope 206, and the transition between the low magnitude 204 and the high magnitude 202 occurs at a second slope 208. The time period, $t_2$ 210, for a single bit-length at the low magnitude is a dwell time.

Figure 3:
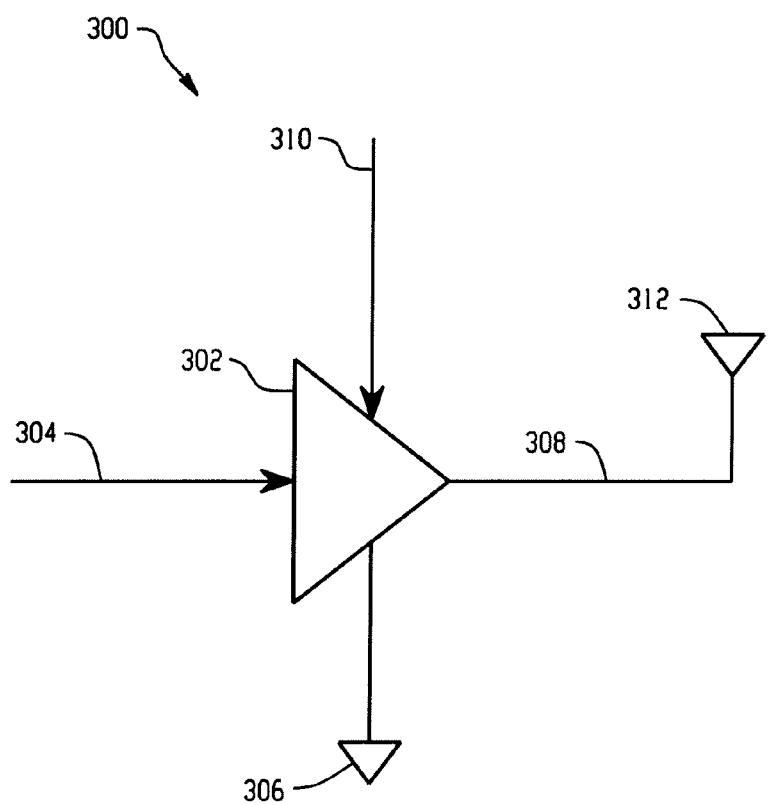
FIG. 3 is a block diagram depicting an example amplifier connected to a transmitter antenna.

An amplifier, such as the amplifier depicted in FIG. 1 may be utilized in a variety of contexts. FIG. 3 is a block diagram depicting an example amplifier connected to a transmitter antenna. An amplifier 302 is connected to a switch node 304 and a ground node 306. The amplifier 302 outputs an AC output signal 308 that is proportional in magnitude to an amplitude modulation signal 310. The AC output signal 308 is provided to an antenna 312 that propagates an electromagnetic or other signal that is proportional to the AC output signal 308.

Figure 4:
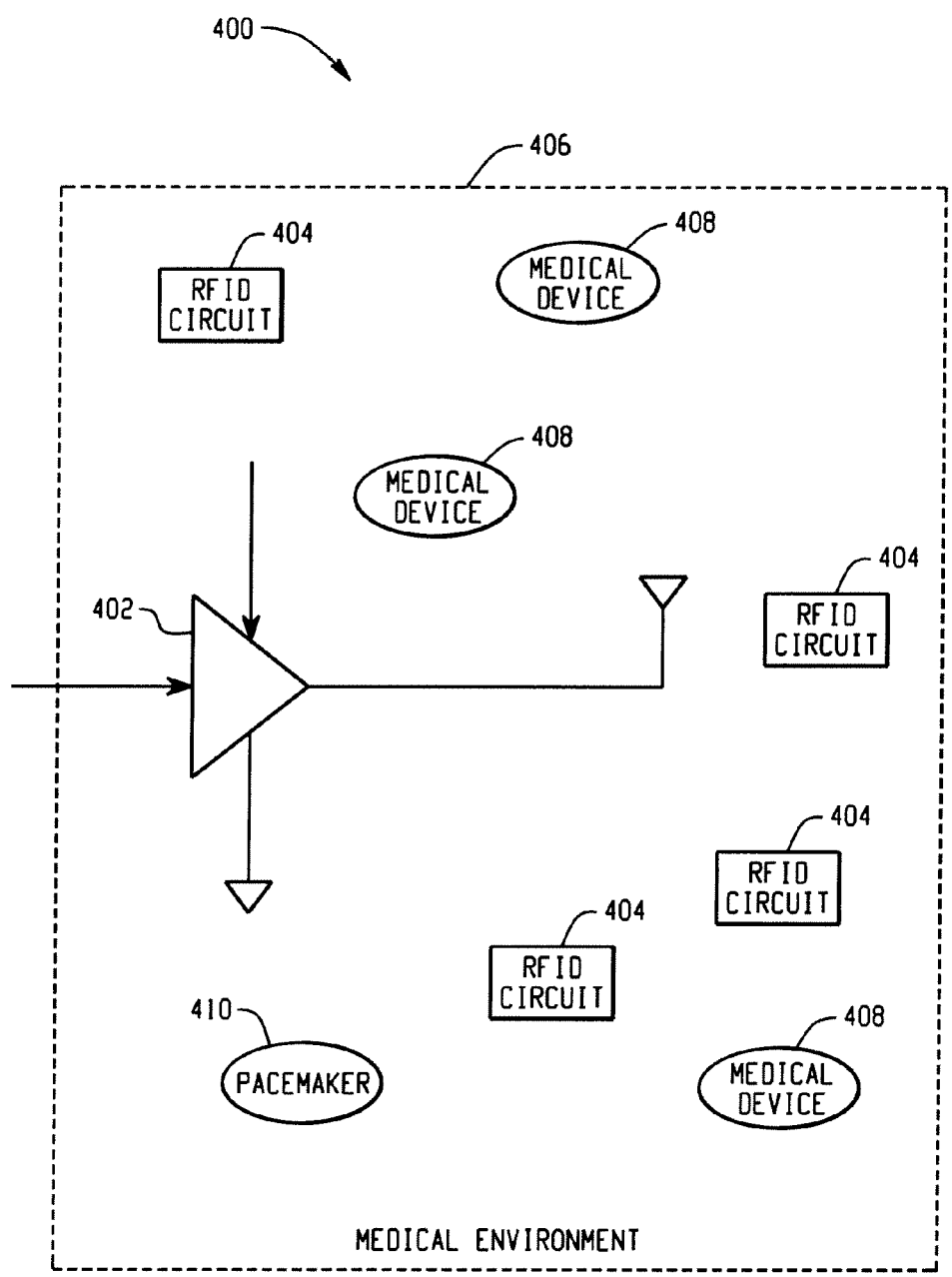
FIG. 4 is a block diagram depicting an amplifier/antenna combination deployed in a medical environment.

Such a configuration may be used in a variety of implementations. FIG. 4 is a block diagram depicting an amplifier/antenna combination deployed in a medical environment. The amplifier/antenna combination 402 is used for activating RFID circuits 404 located within the medical environment 406 RFID circuits 404 may be programmed to listen for certain bit sequences, which may be represented by certain amplitude patterns of a signal at a particular frequency transmitted by the amplifier/antenna combination 402. When an RFID circuit 404 detects an appropriate signal, the RFID circuit 404 may respond, such as with a reply signal containing data. The data may be representative of a variety of information, such as a unique identifier of the RFID circuit that can be used to identify an item to which the RFID circuit is attached. Other electronic instruments may also be present in a medical environment 406, such as medical devices 408 and pacemakers 410. Medical devices 408 and pacemakers 4 may be susceptible to interference produced by signals transmitted by the amplifier/antenna combination 402. For example, a heart monitor medical device could erroneously recognize a signal transmitted by the amplifier/antenna combination 402 as part of a heart beat signal. Similarly, a pacemaker 410 may recognize a signal from the amplifier/antenna combination 402 as an irregular heartbeat and may take corrective action, such as providing an electric shock to a heart to which the pacemaker 410 is connected. Such a situation can be very dangerous.

It may be desirable to use RFID circuits 404 in a medical environment 406. During a surgical procedure, items are often counted repeatedly by the surgical staff in order to ensure that nothing is inadvertently left inside of a patient's open body cavity. Items most commonly counted to prevent accidental retention include surgical sponges, towels, and small instruments. Retained items are known to cause dangerous complications such as infection, pain, and even death.

Presently, there is a manual method widely employed to prevent retained items. This method consists of counting each item before, during, and after surgery to ensure that starting counts reconcile with final counts. This method indirectly validates that nothing is retained inside the body by accounting for all items used by the end of the surgery. Guidelines vary slightly, but in general these counts are standardized across hospitals in the United States, and they include a starting count, post-operative count, and several intermediate counts at various stages of the surgery. These counts must be maintained as an ongoing tally in order to account for new items introduced mid-procedure, such as a new pack of sponges used to address unexpected bleeding.

Manual counts are often flawed and error-prone despite proactive measures such as standardization of counts and reactive punitive measures such as mandatory public reporting of retained object incidents and imposition of fines on hospitals where such errors occur. Manual counting is made difficult by the large number of items to be counted and the stressful chaotic operating room environment. Further risk factors for retained objects include large patient body mass and the color, consistency, and adherence of sponges when used to absorb blood and body fluids. Sponges are difficult to discern when soaked with blood, particularly in larger patients.

More recently, technological advances have been aimed at improving the process of manual counting and augmenting or replacing it with an automated, machine-validated count.

One such system is a RFID based system which consists of a plurality of marker tags, each containing a unique data string, permanently attached to each surgical item. In addition to a unique number, the marker tags may contain some data about the item to which they are attached, such as the type of item, manufacturer information, etc. The system also consists of a reader, which is configured to scan the tagged items, detecting their markers, and displaying information to the user about the type and quantity of items detected.

RFID systems for surgical sponge and instrument management may be configured to both count and detect tagged items. Because RFID tags contain unique data strings, they can be individually counted. Because the tags may communicate from a predetermined distance with no line-of-sight requirement and can effectively read through the human body, the patient may be scanned as a "safety check" for retained items. RFID systems may have multiple modules in communication with each other that are each configured for one of these various functions. For example, one module may be configured for validating the count of sponges being entered into surgery, while another module may be configured for scanning the patient for retained items.

An element of these surgical RFID systems is the RFID reader circuitry. This circuitry is typically in communication with a processor that, in addition to controlling the RFID reader, may also control a display, user controls, and other peripheral devices that contribute to the overall functionality of the system. The RFID reader is responsible for powering one or more antennas, thus creating a radiofrequency field which establishes communication with one or more marker tags. The reader issues a series of commands to these tags and receives and decodes their responses. These responses are passed to the processor, where they are further deciphered into information for display to the user, such as the quantity and type of items within the detection range of the antennas.

The RFID reader may be characterized by its carrier frequency, power output, and modulation scheme. Each of these parameters may be considered from the standpoint of system performance as well as environmental, interoperability, and regulatory perspectives. Certain carrier frequencies may be better-suited for particular environments. For example, to read through a human body to detect and identify RFID tags, a carrier frequency may be selected that has low attenuation through fluids.

Power output is related to performance characteristics such as maximum read range of tags. Modulation, the system of variation in the carrier frequency's amplitude or frequency to convey data, may determine how effectively the tag can deliver its information to the reader. Each parameter may be selected to optimize performance. However, in the surgical environment there are multiple competing concerns that may work to prevent system designers from optimizing performance.

One issue that is faced in the surgical environment is that of maximizing read range of RFID tags while satisfying regulatory requirements of interoperability of electronic devices. Each device deployed in the operating room, unless exempt from regulations, is subject to a spectral analysis in some frequency range that includes its operating, or carrier, frequency. A series of power limits is applied, which vary by frequency. Viewed in the frequency domain, this set of power limits is called a spectral mask. A common characteristic of these spectral masks is that they allow a relatively high power output at the operating frequency of a device, but this limit drops off quickly above and below the operating frequency. When a device, such as an RFID reader, operates by communicating bits of data, these bits are usually comprised of rapid changes in amplitude or frequency that represent ones and zeros. Using amplitude modulation as an example, ones and zeros are represented by changes in the amplitude of the carrier, where the magnitude of these changes is defined as the modulation depth.

Existing modulation techniques create square pulse shapes, which result in harmonics that may have deleterious effects from a regulatory and interoperability standpoint. For example, square pulses create unnecessary low frequency spectral components, visible as wider spread around the carrier frequency in the frequency domain, which usually require the designer of such a system to lower the overall transmitted power in order to comply with the regulatory spectral mask.

Additionally, it has been shown that certain low frequency spectral components, particularly those in the same ranges as biological frequencies, may impact the operation of certain medical devices that are tuned to detect such frequencies. For example, cardiac rhythm management devices (CRMDs) are highly sensitive devices tuned to detect low-level electrical impulses from the heart in the range of 0-100 kHz. In a surgical environment, devices with carrier frequencies in this range, those with modulation rates in this range, or those with other low-frequency spectral components in this range, are at risk of interfering with such devices.

Figure 5:
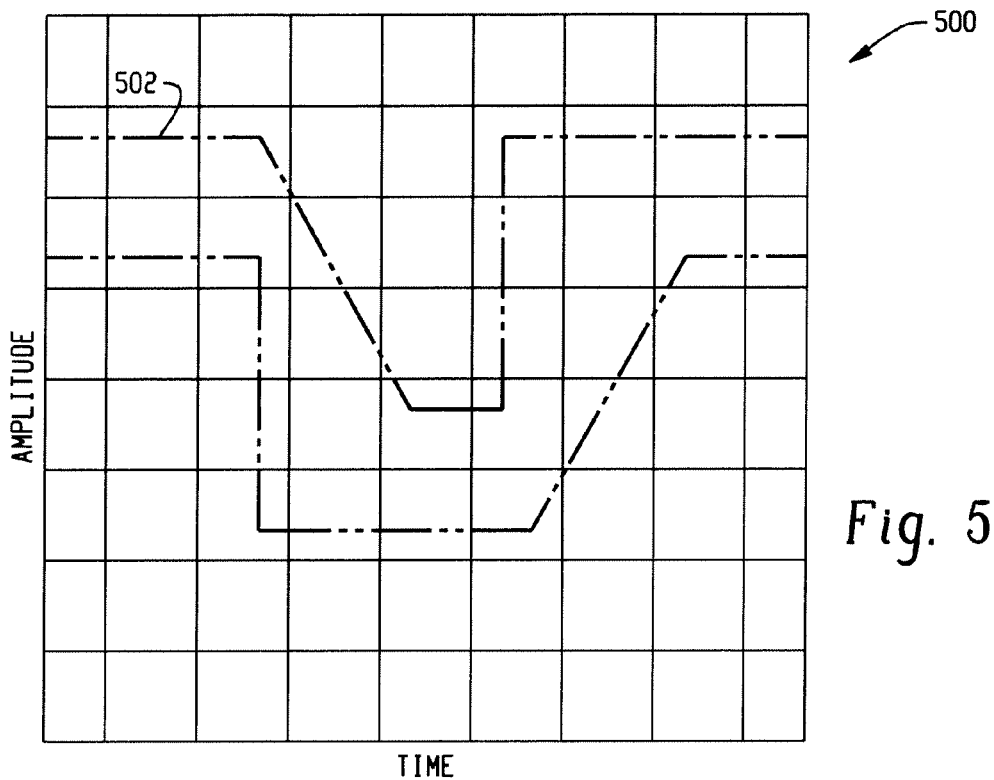
FIGS. 5 and 6 depict an example signal mask for a bit sought by an RFID circuit in accordance with an RFID standard.

FIG. 5 depicts an example signal mask 502 for a bit sought by an RFID circuit. An RFID circuit may wait in a dormant state until a signal having an expected amplitude pattern of one or more bits at a particular frequency is detected. The mask of FIG. 5 shows the range over which a single amplitude shift keying transition can occur. When a specific signal pattern is detected, the RFID circuit is programmed to transmit response data. For example, the RFID circuit may transmit a unique identifier of the RFID circuit as well as other data programmed onto the RFID circuit. The RFID circuit may utilize power from the received polling signal that awakened the RFID circuit, or the RFID circuit may include a battery or other power source to use in transmitting a response signal.

Figure 6:
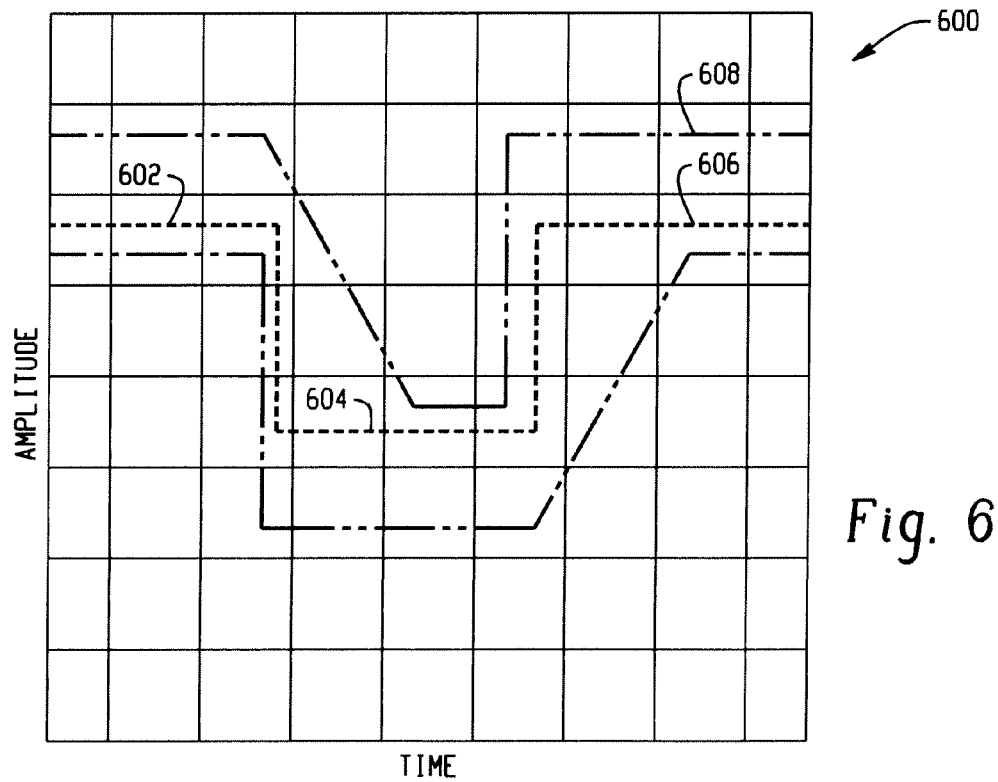

FIG. 6 depicts an example square wave signal within the example mask, where a pattern of bits falling within bit masks would awaken an RFID circuit. The example signal is received at the particular frequency at a high magnitude 602, transitions to a low magnitude 604, and transitions back to a high magnitude 606, all within the mask 608 listened for by the RFID circuit. Upon detecting such an expected bit pattern, an RFID circuit may be awakened to transmit data via an antenna responsive to the RFID circuit.

By quickly changing the amplitude of the AC output signal from high magnitude to low magnitude back to high magnitude, the spectral density of the AC output signal may be quite large, outputting significant amounts of power at several frequencies outside of the particular carrier frequency of the amplifier. FIG. 7 is a graph depicting the spectrum of the square wave signal depicted in FIG. 6. FIG. 7 depicts the power of the square wave signal as a function of frequency.

The square wave signal includes a large power component at the carrier frequency, shown in the center of the graph. However, the square wave signal also includes significant power at other frequencies. The power emitted at other frequencies can be problematic for a number of reasons. For example, the power at frequencies outside of the carrier frequencies may cause interference with other electronic devices, such as the medical devices and pacemakers depicted in FIG. 4. As another example, certain regulations may require limitation of power transmitted at certain frequencies. For example, the Federal Communications Commission (FCC) may require that certain devices limit their emissions outside of a permitted carrier frequency. Such a requirement may be implemented by requiring devices to limit their emissions to fit within a mask. FIG. 7 depicts an example regulatory mask 702 within which a device may be required to remain. At several points 704, the square wave signal of FIG. 6 transmits power outside of (above) the mask 702.

Figure 8A:
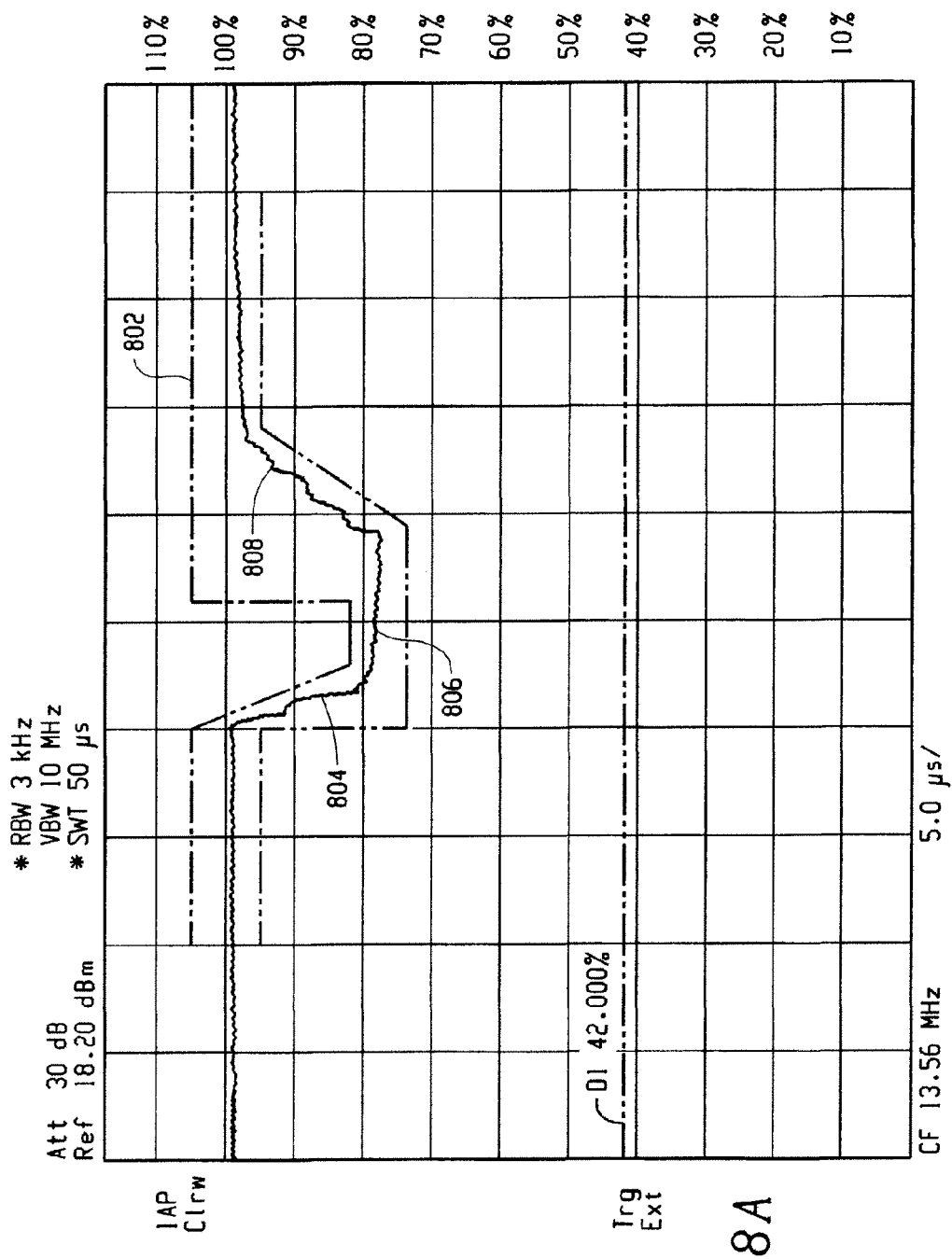
FIGS. 8A and 8B depict graphs showing signals that traverse a mask utilizing slope control.
Figure 8B:
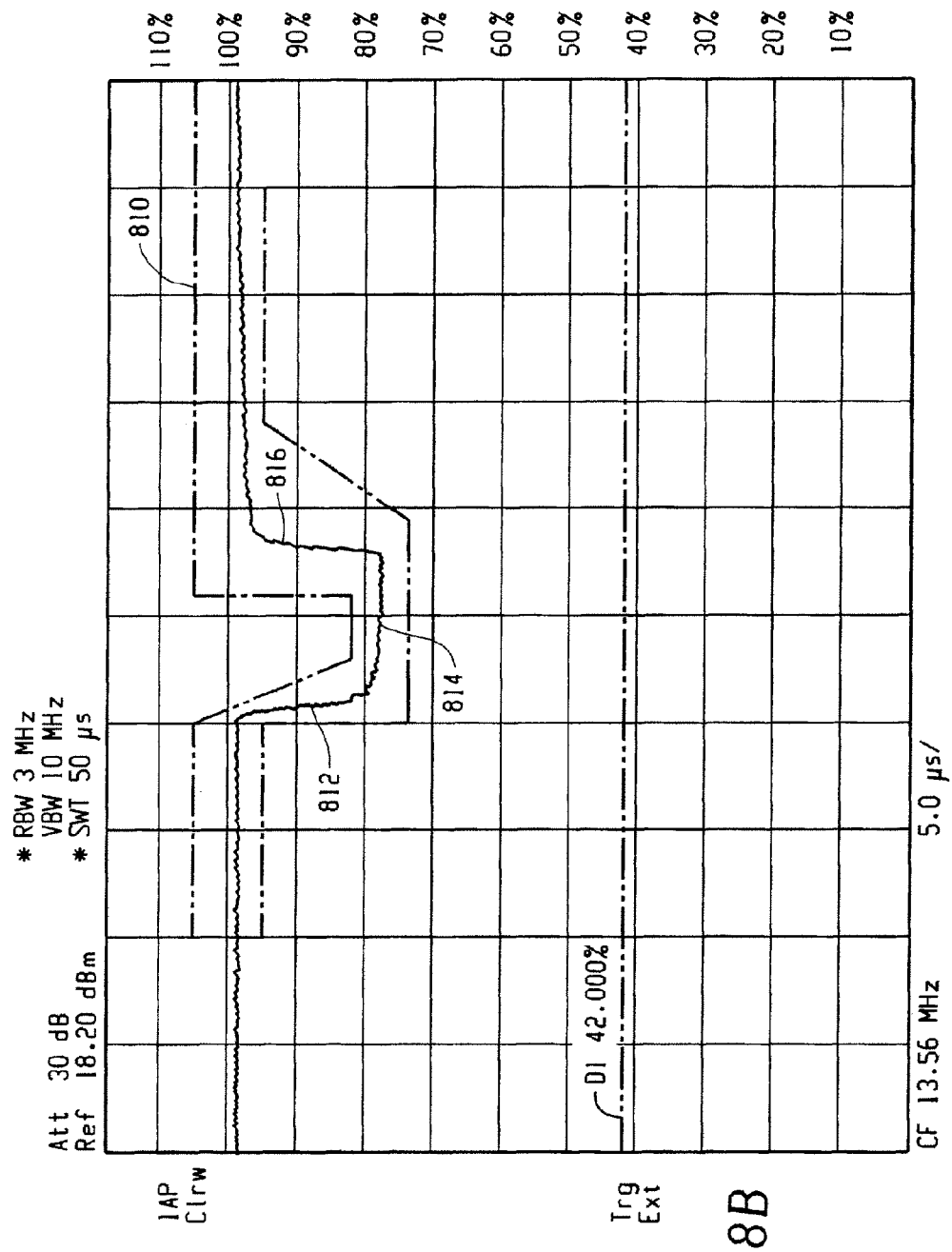

FIGS. 8A and 8B depict graphs showing signals that traverse a mask utilizing slope control. As shown in FIG. 8A, there are alternate ways for a signal at the particular carrier frequency to remain within a mask 802, such as one sought by an RFID circuit. FIG. 8A depicts a signal at the carrier frequency that utilizes a moderate slope 804 to transition from a high magnitude to a low magnitude, a dwell time shown at 806, and a gradual slope 808 from the low magnitude to the high magnitude. The signal depicted in FIG. 8A remains within the mask 802, making it detectable by devices listening for such a signal. However, the signal depicted in FIG. 8A will have a different spectrum than the square wave signal depicted in FIG. 6.

FIG. 8B depicts an alternate signal at the particular frequency that remains within the mask 810. The signal in FIG. 8B includes a steep slope 812 in transitioning from the high magnitude to the low magnitude, a dwell time shown at 814, and a fairly steep slope 816 in transitioning from the low magnitude to the high magnitude. The spectrum of the signal in FIG. 8B differs from that of the signal depicted in FIG. 8A as well as that of the square wave signal depicted in FIG. 6.

Figure 9:
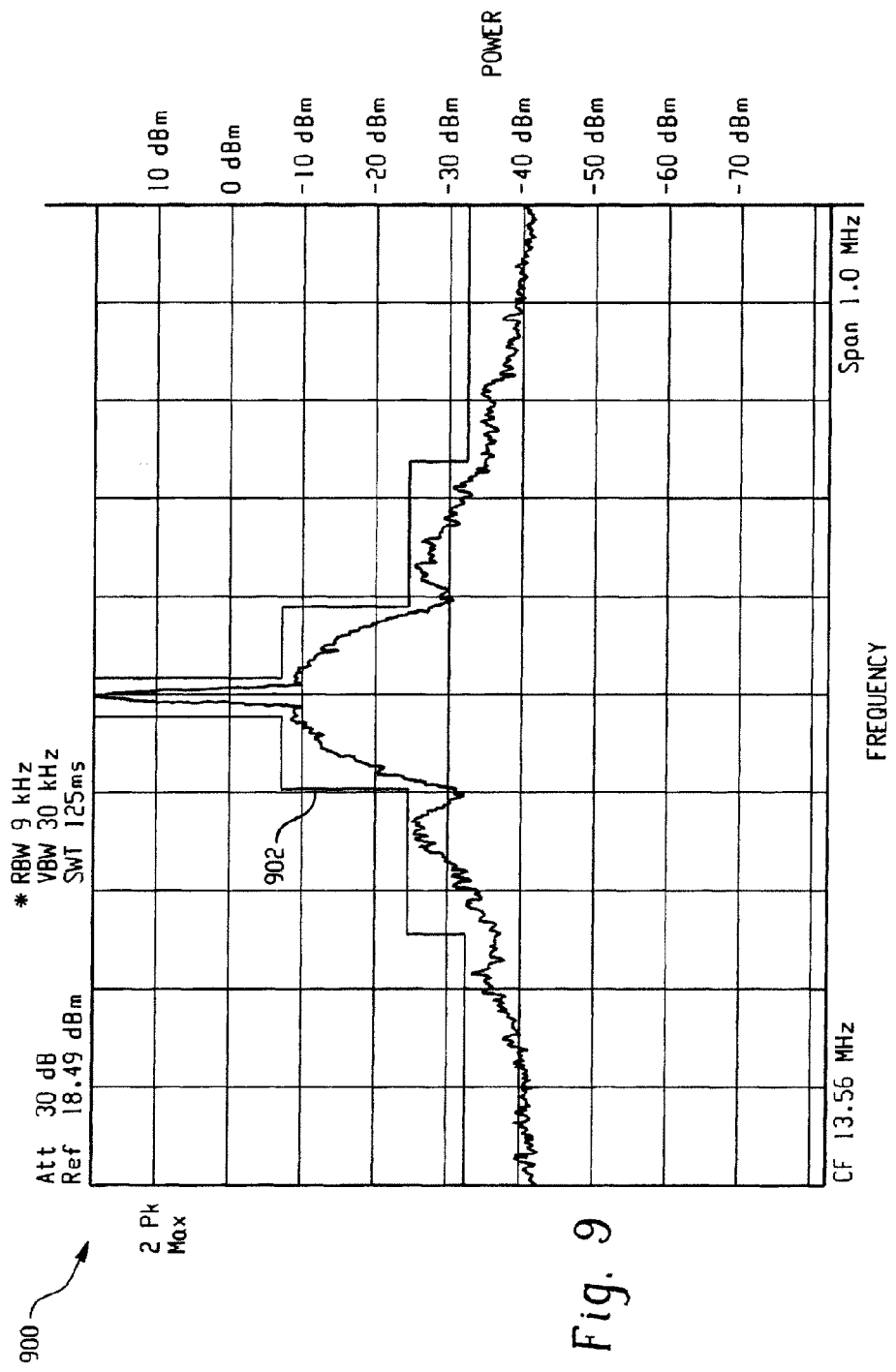
FIG. 9 depicts the spectrum of the signal of FIG. 8A.

FIG. 9 depicts the spectrum of the signal of FIG. 8A. As discussed above, the addition of slope control, as opposed to a fast transition from high magnitude to low magnitude back to high magnitude, enables modification of the spectrum of the signal. This is illustrated by the application of a similar mask 902 in FIG. 9 as the mask applied to the square wave signal spectrum in FIG. 7. While the square wave signal spectrum in FIG. 7 violated the mask at several points, the spectrum of the slope controlled signal remains within the example mask 902.

Figure 10:
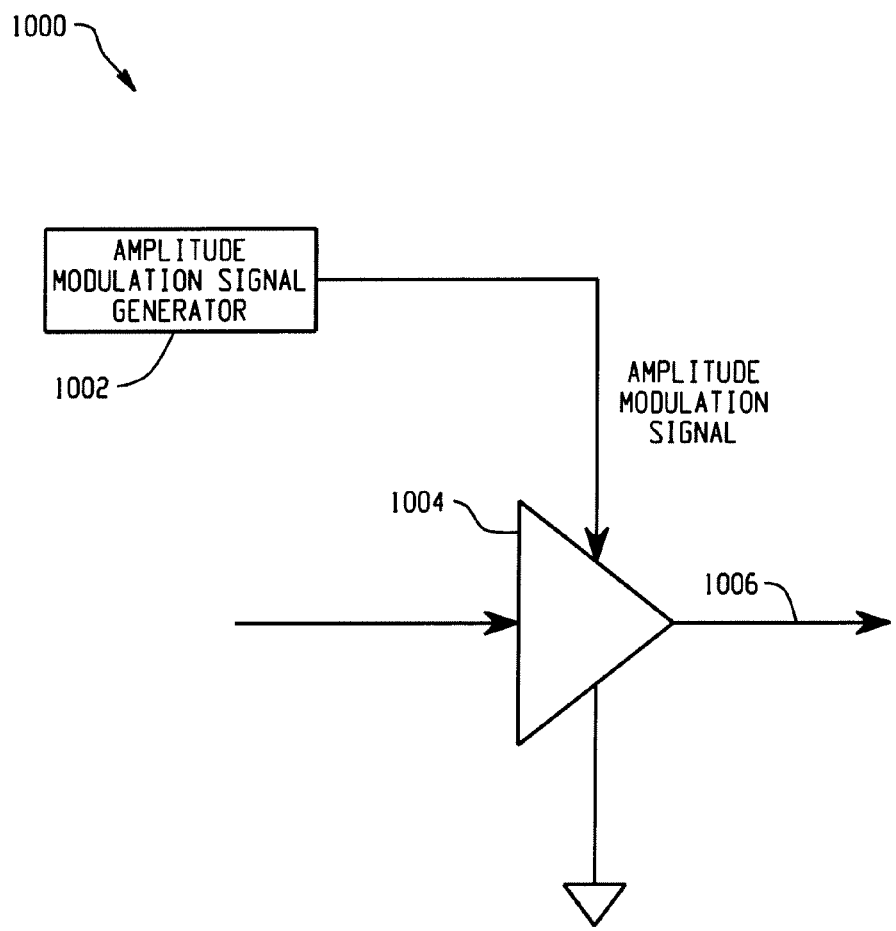
FIG. 10 depicts an example system for controlling the amplitude modulation signal provided to an amplifier.

FIG. 10 depicts an example system for controlling the amplitude modulation signal provided to an amplifier. Previously, systems may have directly applied a data signal to an amplifier as the amplitude modulation signal. For example, directly applying a data signal transitioning from a 1 to a 0 back to a 1 could create the square wave signal at the particular carrier frequency shown in FIG. 6. Such a system may be suboptimal based on power emitted outside of the particular carrier frequency.

FIG. 10 depicts a system that enables configurable slope control that facilitates shaping of the spectrum of the signal. A data signal may be received by an amplitude modulation signal generator 1002. The received data signal may be modified prior to transmitting the data signal to the amplifier 1004 for transmission as an AC output signal 1006. For example, the slope of transitions from a first magnitude to a second magnitude and from the second magnitude to the first or another magnitude may be adjusted. Other parameters of the data signal, such as a dwell time for a bit may also be adjusted by the amplitude modulation signal generator 1002.

Figure 11:
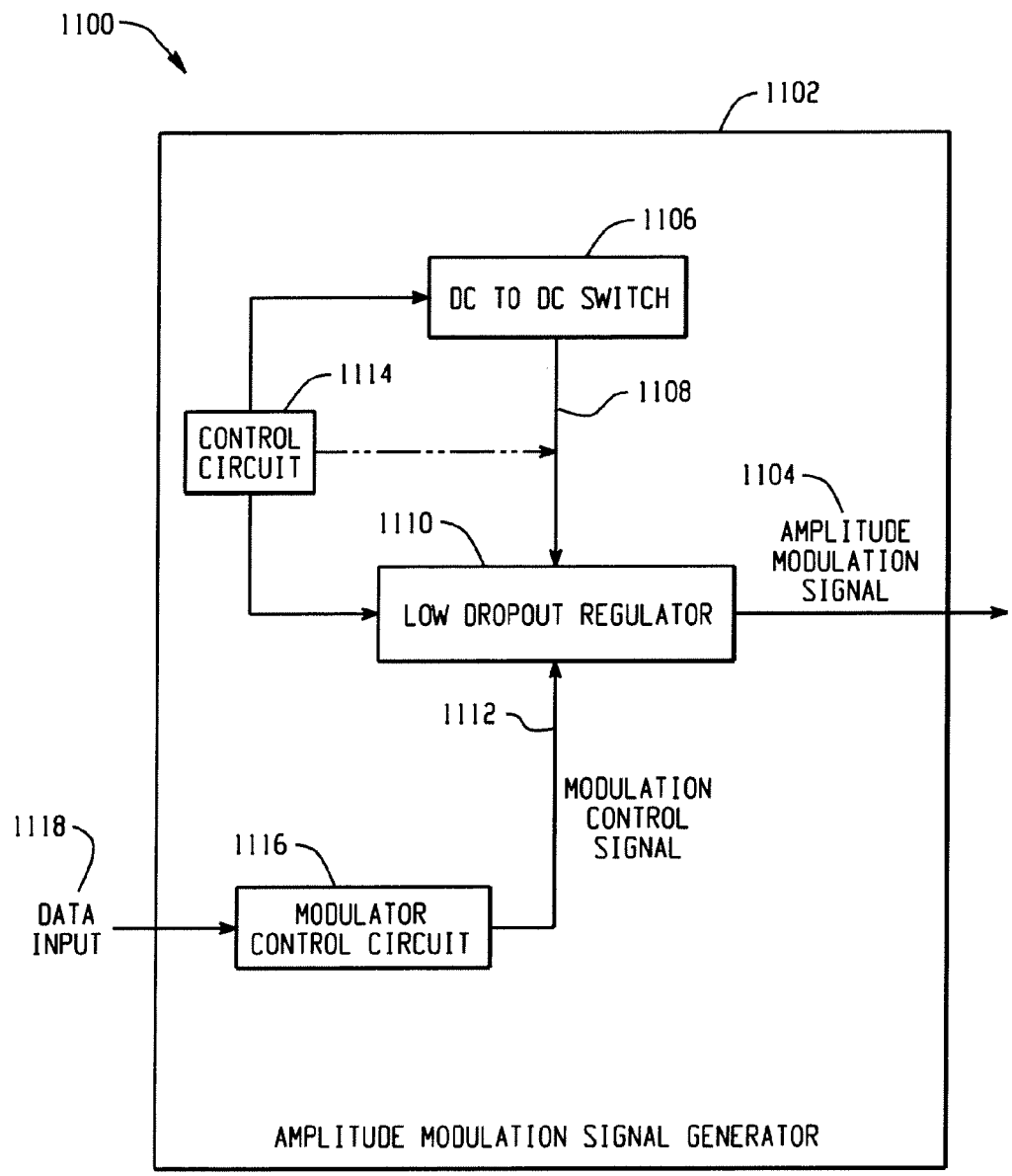
FIG. 11 is a block diagram depicting example components of an amplitude modulation signal generator.

FIG. 11 is a block diagram depicting example components of an amplitude modulation signal generator. The amplitude modulation signal generator 1102 generates an amplitude modulation signal 1104, such as to a switchmode power amplifier. The amplitude modulation signal generator includes a DC to DC switch 1106 configured to receive a DC input voltage and to provide a DC output voltage 1108. A low dropout regulator 1110 is configured to provide the amplitude modulation signal 1104 according to a modulation control signal 1112 received by the low dropout regulator 1110. The low dropout regulator is powered by the DC output voltage 1108. A control circuit 1114 is connected to the DC to DC switch 1106 and the low dropout regulator 1110. The control circuit 1114 is configured to establish a nominal operating power level for the power amplifier via the amplitude modulation signal 1104 and to maintain a minimum voltage difference between the DC output voltage 1108 and the low dropout regulator 1110. A modulator control circuit 1116 is configured to provide the modulation control signal 1112 to the low dropout regulator 1110. The modulation control signal 1112 includes transitions from a high amplitude to a low amplitude back to a high amplitude, such as, for example, dictated by a data input signal 1118. The modulator control circuit 1116 provides the transition from the high amplitude to the low amplitude at a configurable first slope, and the modulator control circuit 1116 provides the transition from the low amplitude to the high amplitude at a configurable second slope. The modulator control circuit 1116 may also control other aspects of the modulation control signal 1112 such as dwell times for a single bit and a modulation depth between different signaling levels.

Figure 12A:
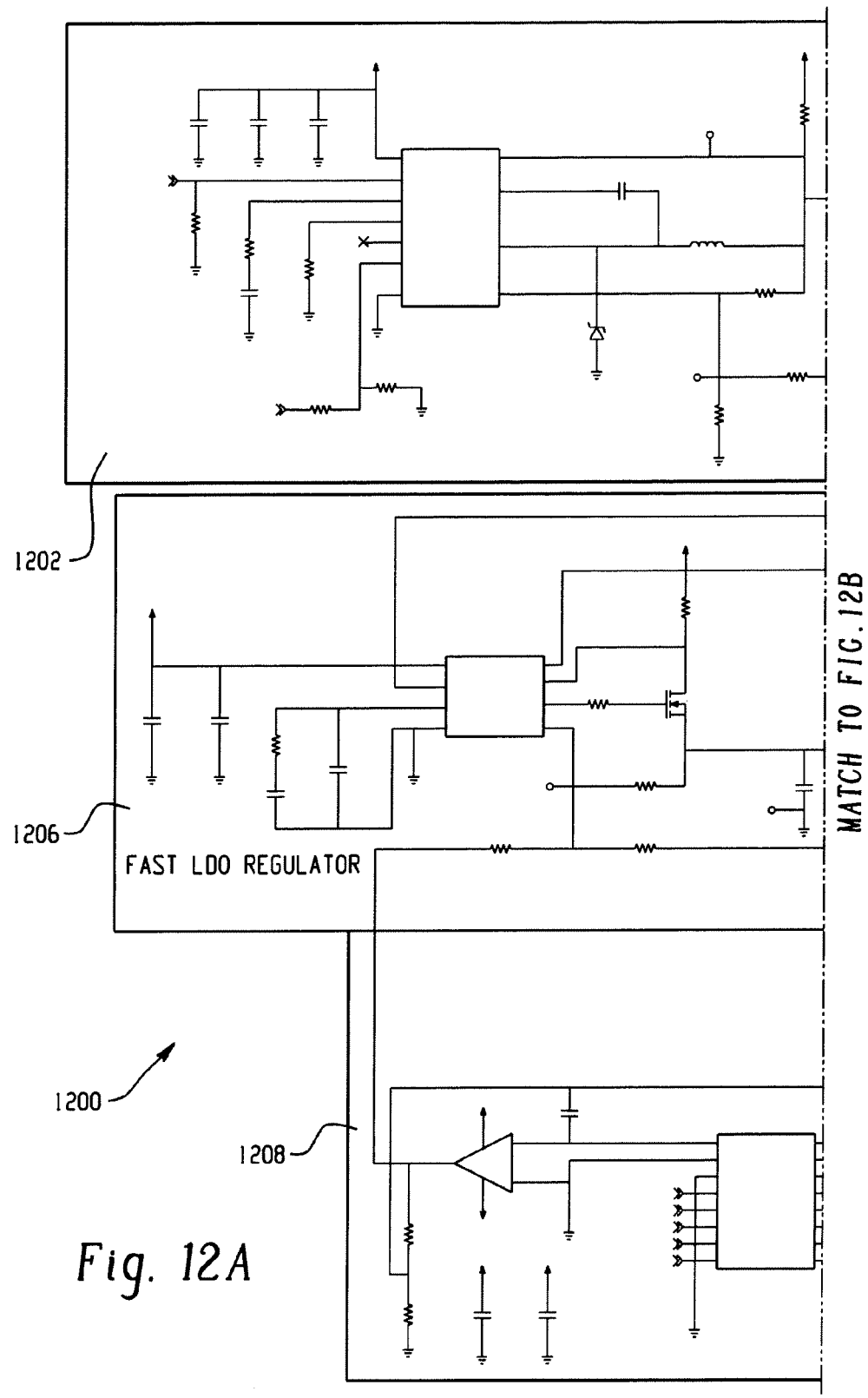
FIGS. 12A and 12B illustrate a schematic depicting an example implementation of an amplitude modulation signal generator.
Figure 12B:
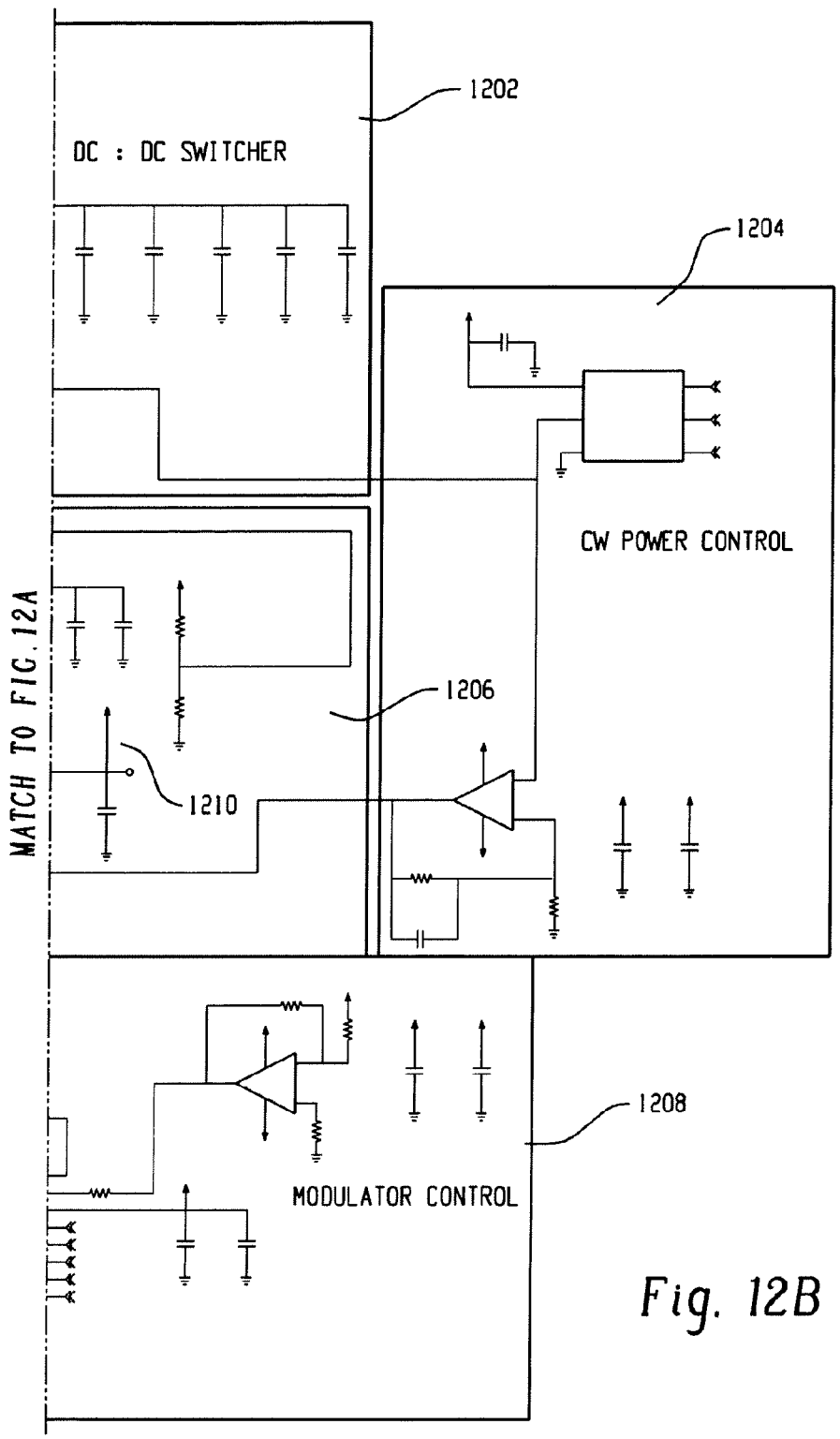

FIGS. 12A and 12B illustrate a schematic depicting an example implementation of an amplitude modulation signal generator. A DC to DC switch 1202 receives an input voltage and provides a DC output voltage with very efficient conversion. The DC to DC switch 1202 provides the DC output voltage to a low dropout regulator 1206 for power. The low dropout regulator 1206 may have a high switching speed capability compared to the DC to DC switch 1202. Controlling the voltage difference between the output 1202 and the output of the low dropout regulator 12 to maintain a minimum operating voltage difference (e.g., 0.5 volts) enables the system to maintain a high efficiency.

A modulator control circuit 1208 provides the modulation control signal to the low dropout regulator 1206. The modulator control circuit 1208 provides shaping of a data signal to be output from the amplitude modulation signal generator such as slopes for transitions from signaling levels, modulation depth between signaling levels, dwell times for bits, as well as others. The low dropout regulator 1206 provides the AC output signal, such as to an amplifier, at the node labeled +PA_VDD 1210.

Figure 13:
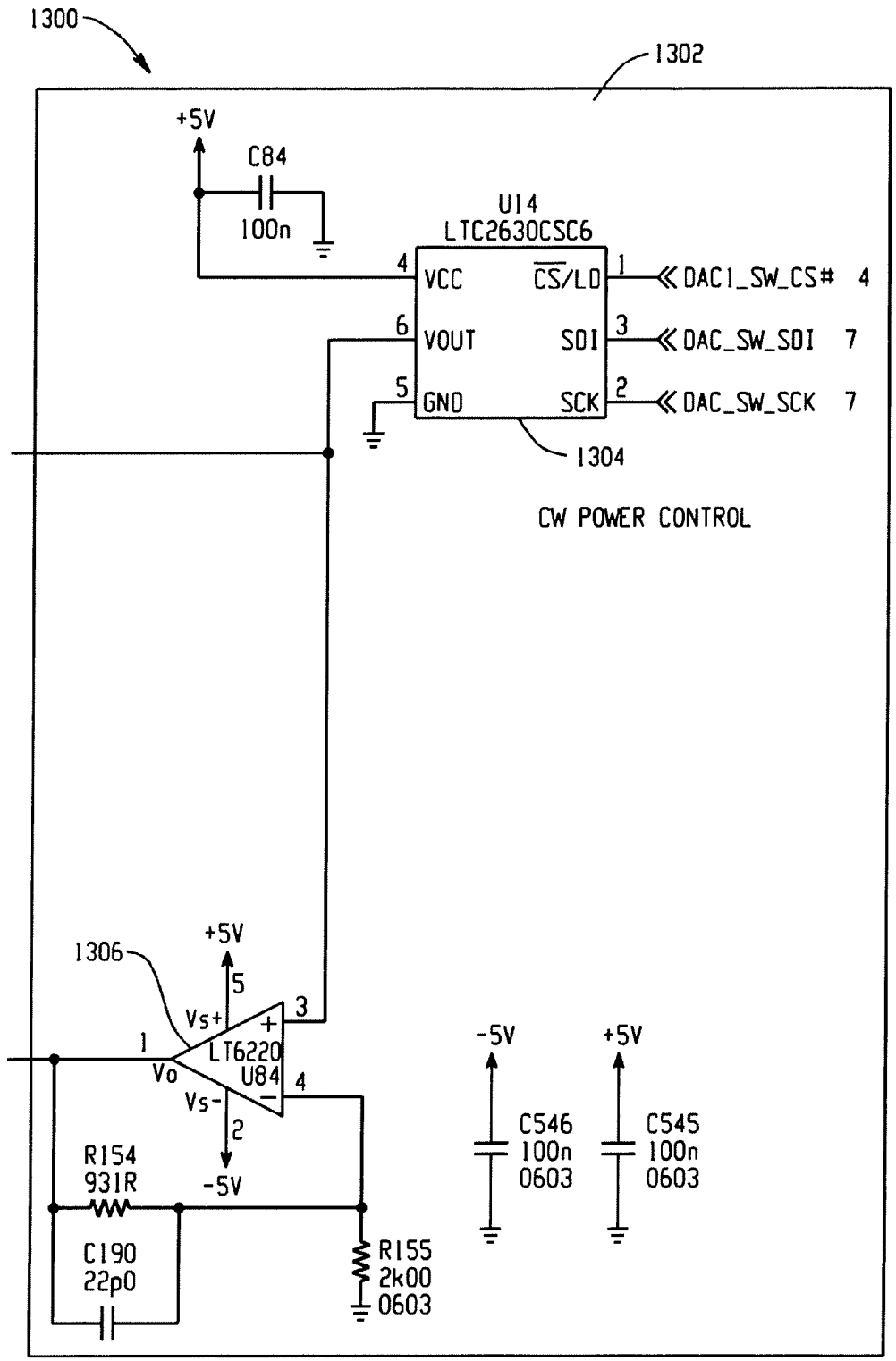
FIG. 13 is a schematic depicting an example implementation of a control circuit.

FIG. 13 is a schematic depicting an example implementation of a control circuit. The control circuit 1302 may include a digital to analog converter 1304 that is digitally controlled by a master device (not shown). The control circuit 1302 may establish a nominal output power of an amplifier (not shown), which is controlled by the amplitude modulation signal at +PA_VDD shown in FIGS. 12 and 1. The control circuit 1302 controls the output of the DC to DC switch.

Figure 14A:
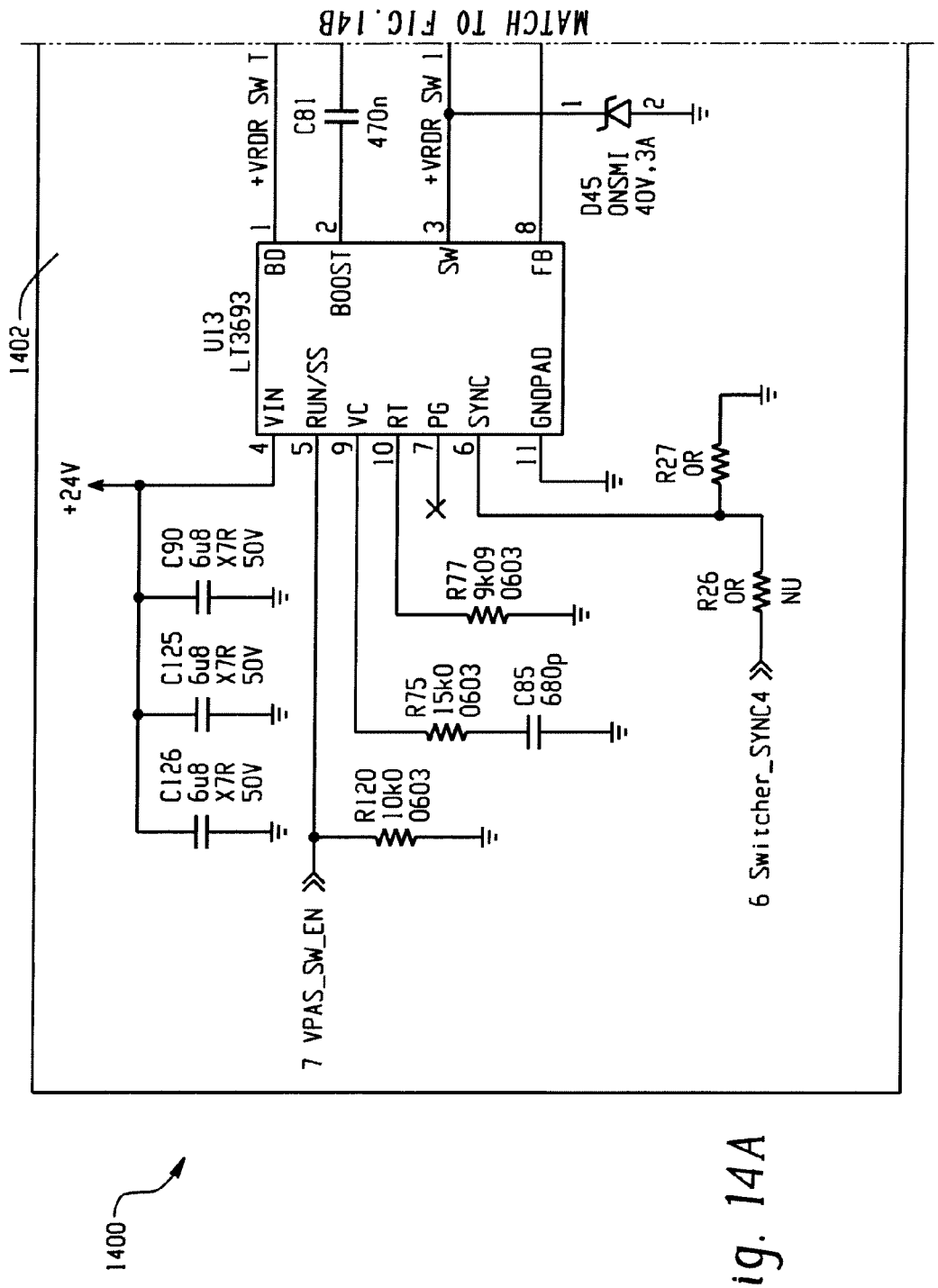
FIGS. 14A and 14B illustrate a schematic depicting an example implementation of a DC to DC switch.
Figure 14B:
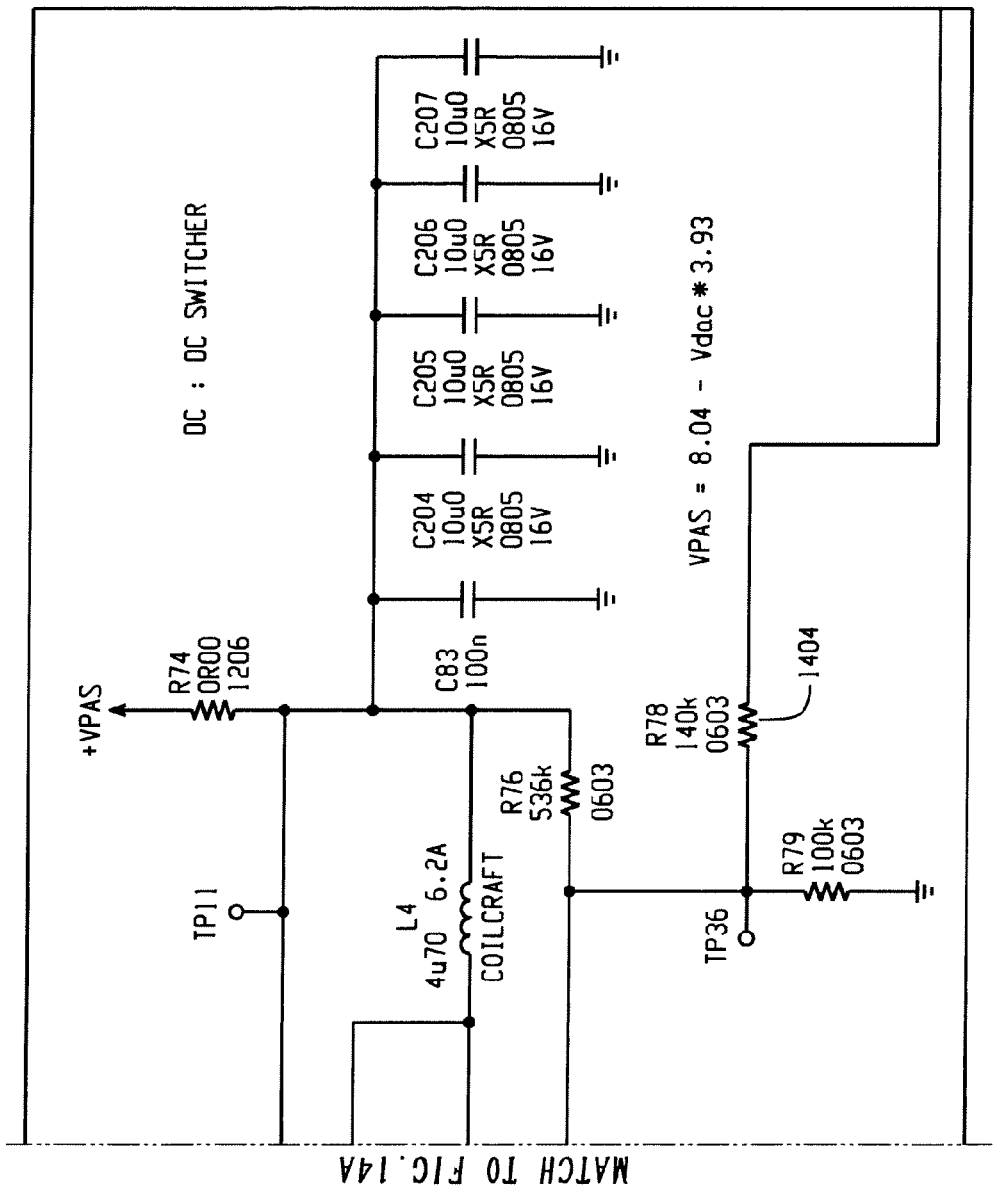

FIGS. 14A and 14B illustrate a schematic depicting an example implementation of a DC to DC switch. The control circuit controls the output of the DC to DC switch 1402 by introducing a current into a feedback of the DC to DC switch via a voltage output divide by resistor R78 at 1404. With reference back to FIG. 13, the digital to analog converter 1304 of the control circuit 1302 also supplies a voltage to operational amplifier U84 at 1306, which introduces a current into a feedback node of a high speed low dropout regulator.

Figure 15A:
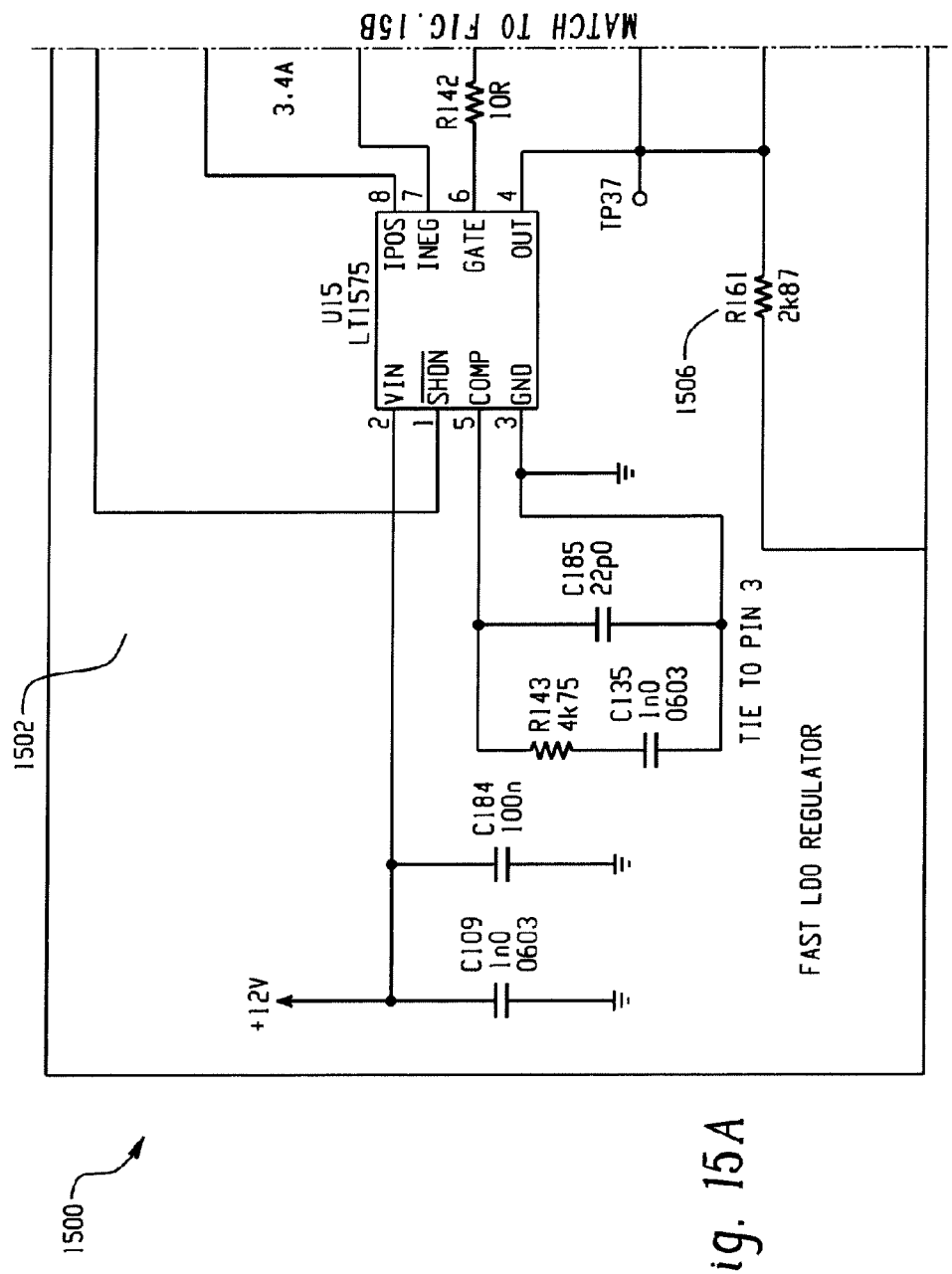
FIGS. 15A and 15B illustrate a schematic depicting an example implementation of a low dropout regulator.
Figure 15B:
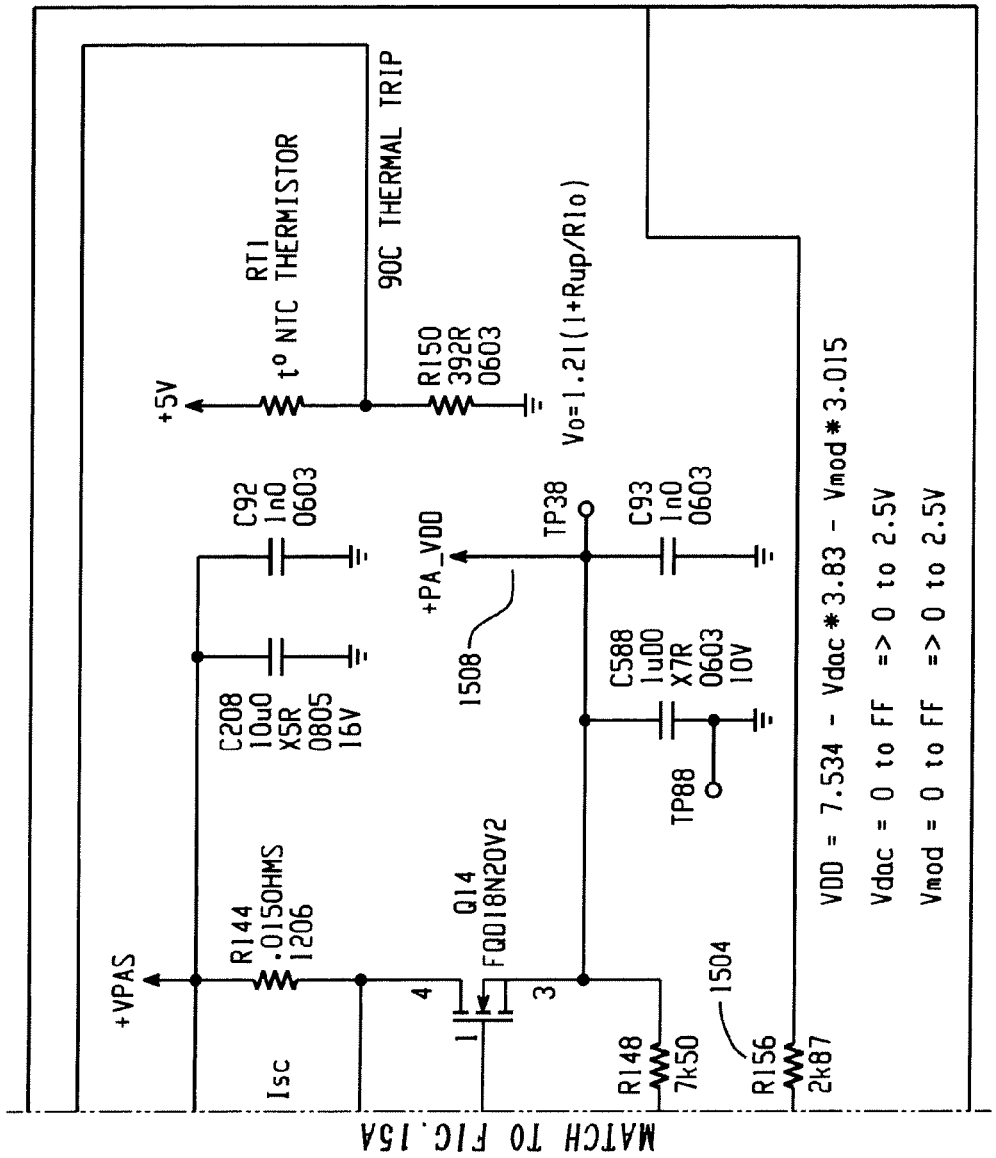

FIGS. 15A and 15B illustrate a schematic depicting an example implementation of a low dropout regulator. The low dropout regulator 102 receives the signal from the control circuit at resistor R16, shown at 104. The input from the control circuit received at 104 may be configured to maintain a minimum voltage difference between the output of the DC to DC switch, shown in FIGS. 14A and 14B and the input to the low dropout regulator 102, such as at 0.V. This configuration enables high overall efficiency because the voltage drop of the low dropout regulator is maintained at 0.V below the DC to DC switch output.

Figure 16A:
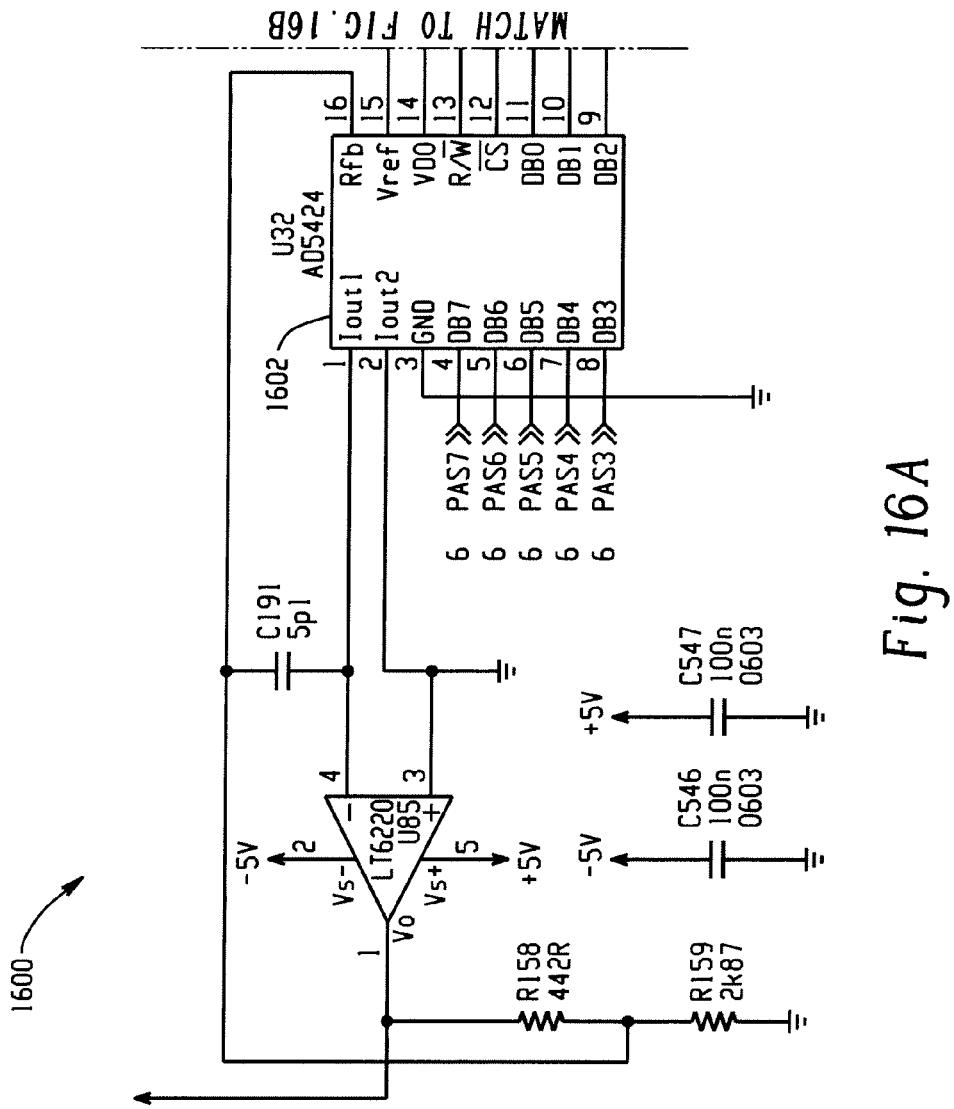
FIGS. 16A and 16B illustrate a schematic depicting an example modulator control circuit.
Figure 16B:
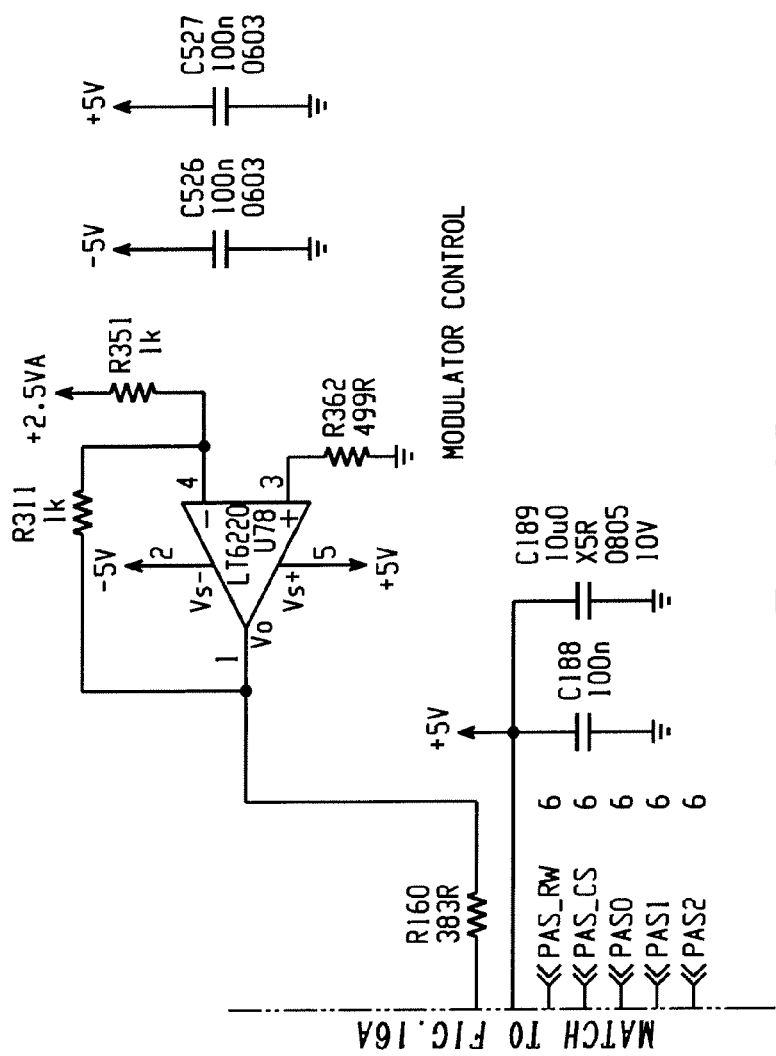

FIGS. 16A and 16B illustrate a schematic depicting an example modulator control circuit. The modulator control circuit 1600 provides modulation and wave shaping of the amplifier output. The modulation and wave shaping may be implemented using a high speed digital to analog converter U32, shown at 1602. U32 1602 introduces a second current into the feedback node of the low dropout regulator at 1506. The low dropout regulator reacts by raising or lowering the voltage at the output node +PA_VDD at 108. A master device (not shown) can provide data to be transmitted to the output node +PA_VDD 108 via the modulator control circuit. The master device can also dictate certain parameters of the waveform representing that data to the modulation control circuit. For example, the master device may dictate slopes for changes in amplitude signaling levels, modulation depths, dwell times, and other parameters of the signal. These parameters may be input to the modulation control circuit in a number of ways. For example, the parameters may be dictated digitally or via an analog control, such as via a switch or knob setting.

Many variations of an amplitude modulation signal generator are contemplated by this disclosure. For example, a DC to DC switch may utilize a variety of parts including an LT3693, an LM5576, an LM22678, and an LM 20343. A control circuit may utilize a variety of parts including an LTC2630, an ADS5443, a DAC121S101, and a TLV5638. A low dropout regulator may utilize a variety of parts including an LT1575. A modulator control circuit may utilize a variety of parts including an AD5424, an AD9708, a THS5641, a DAC908, and a TLC7524.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a computer-readable medium for execution by, or to control the operation of, data processing apparatus.

While this specification contains many specifics, these should not be construed as limitations on the scope of the invention or of what may be claimed, but rather as descriptions of features specific to particular embodiments of the invention. Certain features that are described in this specification in the context or separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. For example, the actions recited in the claims can be performed in a different order and still achieve desirable results.

The invention claimed is:

1. An apparatus for generating an amplitude modulation signal, comprising:
   a modulator control circuit configured to generate a modulation control signal including transitions from a high amplitude to a low amplitude back to a high amplitude, the modulator control circuit is configured to provide the transition from the high amplitude to the low amplitude at a first slope, the modulator control circuit is configured to provide the transition from the low amplitude to the high amplitude at a second slope, wherein the modulator control circuit is adapted to selectively configure at least one of the first and second slopes to comply with a spectral mask; and
   a low dropout regulator configured to receive the modulation control signal from the modulator control circuit and provide the amplitude modulation signal according to the modulation control signal.

2. The apparatus of claim 1, further comprising a switchmode power amplifier responsive to the amplitude modulation signal, the switchmode power amplifier configured to provide an AC output signal proportional to the amplitude modulation signal.

3. The apparatus of claim 2, wherein the modulator control circuit is adapted to selectively configure at least one of the first and second slopes to reduce the spectral density of the AC output signal.

4. The apparatus of claim 3, wherein the spectral density is reduced to comply with the spectral mask.

5. The apparatus of claim 1, wherein the modulation control signal is configured to remain at the low amplitude for a dwell time, wherein the modulator control circuit controls the length of the dwell time.

6. The apparatus of claim 1, wherein the modulator control circuit is configured to receive a first slope input, a second slope input, and a data input, wherein the modulation control signal is a representation of the data input, wherein the first slope is controlled by the first slope input, wherein the second slope is controlled by the second slope input.

7. The apparatus of claim 1, wherein the modulator control circuit is configured to receive a modulation depth input, wherein a difference between the high amplitude and the low amplitude is controlled by the modulator control circuit according to the modulation depth input.

8. The apparatus of claim 2, wherein the AC output signal is connected to an antenna.

9. The apparatus of claim 8, wherein the antenna is configured to output an interrogation signal to an RFID circuit that responds to the interrogation signal.

10. The apparatus of claim 9, wherein the interrogation signal is proportional to the AC output signal.

11. The apparatus of claim 9, wherein the RFID circuit is attached to one of a medical sponge and a medical instrument.

12. The apparatus of claim 9, wherein the antenna is configured for use in a medical environment, wherein the modulator control circuit is adapted to selectively configure at least one of the first and second slopes to reduce interference with electronic medical devices.

13. The apparatus of claim 12, wherein the modulator control circuit is adapted to selectively configure at least one of the first and second slopes to reduce interference with a heart pacemaker.

14. The apparatus of claim 1, further comprising a DC to DC switch configured to receive a DC input voltage and to provide a DC output voltage, wherein the low dropout regulator is powered by the DC output voltage.

15. The apparatus of claim 14, further comprising a control circuit connected the DC to DC switch and the low dropout regulator.

16. The apparatus of claim 15, wherein the control circuit is configured to establish a nominal operating power level for the power amplifier via the amplitude modulation signal.

17. The apparatus of claim 15, wherein the control circuit is configured to maintain a minimum voltage difference between the DC output voltage and an output of the low dropout regulator.

18. The apparatus of claim 17, wherein the minimum voltage difference is set at a particular level.

19. An apparatus for generating an amplitude modulation signal for an antenna configured for use in a medical environment, the apparatus comprising:
   a modulator control circuit configured to generate a modulation control signal including transitions from a high amplitude to a low amplitude back to a high amplitude, the modulator control circuit configured to provide the transition from the high amplitude to the low amplitude at a first slope, the modulator control circuit configured to provide the transition from the low amplitude to the high amplitude at a second slope, wherein the modulator control circuit is adapted to selectively configure at least one of the first and second slopes to reduce interference with electronic devices in the medical environment; and
a low dropout regulator configured to receive the modulation control signal from the modulator control circuit and provide the amplitude modulation signal according to the modulation control signal.

* * * * *